(12) United States Patent
Sevastopoulos

(10) Patent No.: US 6,271,719 B1
(45) Date of Patent: Aug. 7, 2001

(54) OPERATIONAL FILTER BUILDING BLOCK

(75) Inventor: Nello George Sevastopoulos, Saratoga, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/145,536

(22) Filed: Sep. 2, 1998

(51) Int. Cl.[7] ........................................ H03K 5/00
(52) U.S. Cl. ..................... 327/552; 327/557; 327/558; 327/559; 330/107; 330/109
(58) Field of Search ......................... 327/552, 558, 327/559, 336, 557, 553; 330/107, 109

(56) References Cited

U.S. PATENT DOCUMENTS 4,417,214   11/1983   Sevastopoulos et al. ............... 330/84
4,453,132 *  6/1984   Stamler .................................. 330/107

OTHER PUBLICATIONS

Harry Y–F. Lam, *Analog and Digital Filters Design and Realization*, pp. 401–411, Prentice–Hall, 1979.

* cited by examiner

*Primary Examiner*—Dinh T. Le
(74) *Attorney, Agent, or Firm*—Fish & Neave; Robert W. Morris; Garry J. Tuma

(57) ABSTRACT

A 3-terminal operational filter circuit is presented that can be used to construct various types of active filters. The filter circuit can be configured to provide 2nd order low pass and band-pass frequency responses by coupling three resistors to the three filter terminals. Similarly, the filter circuit can be configured to provide 2nd order band-pass and high pass frequency responses by coupling two resistors and a capacitor to the three filter terminals. Furthermore, a plurality of filter circuits can be cascaded to construct various types of higher order filters. The filter circuit can be manufactured to operate within a selected range of center frequencies by selecting particular values for the internal filter capacitance and resistance. Users can then select a particular center frequency, quality factor, and gain of the filter circuit by selecting particular values for the circuit elements to be coupled to the three terminals.

24 Claims, 11 Drawing Sheets

OPERATIONAL FILTER BUILDING BLOCK

BACKGROUND OF THE INVENTION

This invention relates to electrical filters. More particularly, this invention relates to 2nd order cascadable active-RC filters.

Electrical filters receive signals that typically oscillate between a maximum value and a minimum value (e.g., a sinusoidal signal). These signals are known as AC, or alternating current, signals. (In contrast, signals that maintain a substantially steady value are known as DC, or direct current, signals.) Each oscillation between a maximum and minimum value is a cycle, and the number of cycles per second is the frequency, which is measured in Hertz (one Hertz is one cycle per second). AC signals typically have more than one frequency component. These components can range from low frequencies to high frequencies (e.g., 100 Hz to 100k Hz).

Electrical filters attenuate, or filter out, one or more undesired frequency components from an AC signal, while permitting the other frequency components of the signal to pass through. Depending on the undesired frequencies, different types of filters are used. For example, a low pass filter permits only frequencies below a cutoff frequency to pass through, while frequencies above the cutoff frequency are filtered out. Conversely, a high pass filter permits only frequencies above a cutoff frequency to pass through, while frequencies below the cutoff frequency are filtered out. Band-pass filters permit a range, or band, of frequencies (or only a single frequency) to pass through, while frequencies below a lower bandwidth-edge frequency and above an upper bandwidth-edge frequency are filtered out. Conversely, band-reject or notch filters permit all frequencies except a band of frequencies (or only a single frequency) to pass through. The frequencies allowed to pass through the filter are said to be in the passband, while the filtered out frequencies are said to be in the stopband.

Filters can be of different "orders." For example, filters can be 2nd order low pass filters, 5th order low pass filters, 6th order band-pass filters, and 8th order high pass filters, among many others. The filter order relates mathematically to the transfer function of the filter. The filter transfer function is a ratio of the filter output to the filter input. Typically, this ratio is a function of signal frequency and phase. Filters of the 2nd order are useful because they can be cascaded to form higher order filters. Cascading is the coupling of filters into a series such that the output of one becomes the input of the next.

As is well known in the art, simple circuits including capacitors, inductors, and resistors can be used to construct low pass, highpass, band-pass, and band-reject "passive" filters (e.g., RLC filters). Passive filters provide no signal gain. As such, they are of limited value in many practical applications because signal gain is often required. Furthermore, inductors are generally avoided (particularly at low frequencies) because they have wide tolerances and are bulky, heavy, and non-linear.

"Active" filters provide signal gain and include passive elements and one or more active elements (e.g., transistor devices). Active elements have frequency dependent characteristics and are usually devices that are voltage-dependent or current-dependent. As is known in the art, active filters can be constructed with off-the-shelf operational amplifiers (op amps). However, such op amps usually require numerous external precision components, thus consuming large amounts of circuit board space. Moreover, precision components can be expensive.

Active filters of the 2nd order are characterized by various filter parameters, including center frequency ($f_o$), quality factor (Q), and filter gain. Cutoff frequencies, mentioned above with respect to low pass and high pass filters, are functions of the center frequency and quality factor. Furthermore, the center frequency, quality factor, and filter gain are functions of the various filter circuit elements, and can be calculated accordingly with known filter equations.

Active filters are typically either available as standard off-the-shelf (usually discrete) circuit devices with fixed filter functions and parameters, or are custom designed as either discrete or integrated circuit devices. In either case, such filters usually cannot be easily modified or adjusted to meet application requirements other than those they were originally designed for. In other words, filter functions and parameters usually cannot be easily modified or adjusted once the filter is manufactured, because doing so usually requires either adding additional components and elements, replacing one or more existing circuit elements with different elements (e.g., replacing a resistor with a capacitor), replacing one or more existing elements with elements of different value (e.g., replacing a 10k ohm resistor with a 150k ohm resistor), or all of the above.

For example, FIG. 1A shows a known 2nd order filter that provides low pass and band-pass frequency responses. Filter 100 includes op amps 103, 113, and 123; resistors 101, 107, 109, 111, 117, and 119; and capacitors 105 and 115. Band-pass response $V_1$ is available at node 121, while low pass frequency responses $V_2$ and $V_3$ are respectively available at nodes 125 and 127. To customize filter 100 to particular filter parameters, values for each of the numerous circuit elements are determined based on a cumbersome series of known design equations.

To subsequently use filter 100 for another application requiring different filter parameters, the circuit element values again need to be determined. This will probably result in one or more of these elements requiring replacement. To replace such elements, sufficient access to and appropriate means of replacing them are required. Such a process is often impractical even if filter 100 is a discrete device, and is more likely impossible if filter 100 is an integrated circuit.

Similarly, modifying filter 100 to perform other filtering functions can be equally difficult. For example, to modify low pass filter 100 to provide 2nd order high pass filtering, the following circuit component and elements should be coupled to filter 100, as shown in FIG. 1B: op amp 153 and resistors 151, 157, 159, and 161. Additional calculations need to be performed to determine the values for resistors 151, 157, 159, and 161, and sufficient space needs to be available to add these parts. High pass frequency response VHP is then available at node 166. However, depending on the specified filter parameters, the values of the other circuit elements of filter 150 may also need to be recalculated. This probably will result in one of more of these elements requiring replacement. Again, this process often is impractical if not impossible.

In sum, users are left with few choices for meeting particular filter applications. For example, users can search for an available off-the-shelf filter; laboriously modify, if possible, an existing filter; or custom design a new filter.

In view of the foregoing, it would be desirable to be able to provide a filter circuit that can be easily configured to provide 2nd order low pass, band-pass, band-reject, and high pass frequency responses.

It would also be desirable to be able to provide a filter circuit that can be easily configured to provide a selectable center frequency, quality factor, and gain.

It would further be desirable to be able to provide a plurality of filter circuits that can be easily configured to construct various types of active filters of 2nd order or higher.

It would still further be desirable to be able to provide a plurality of filter circuits that can be fabricated on a single integrated circuit chip.

SUMMARY OF THE INVENTION

It is an object of this invention to provide a filter circuit that can be easily configured to provide 2nd order low pass, band-pass, band-reject, and high pass frequency responses.

It is also an object of this invention to provide a filter circuit that can be easily configured to provide a selectable center frequency, quality factor, and gain.

It is a further object of this invention to provide a plurality of filter circuits that can be easily configured to construct various types of active filters of 2nd order or higher.

It is a still further object of this invention to provide a plurality of filter circuits that can be fabricated on a single integrated circuit chip.

In accordance with this invention, a 3-terminal operational filter circuit is provided. The filter circuit includes an input terminal for receiving an input signal, a first output terminal for providing a first frequency response, and a second output terminal for providing a second frequency response. The filter circuit also includes an operational amplifier, a capacitor, and a non-inverting integrator. The operational amplifier circuit has an inverting input, a non-inverting input and an amplifier output. The inverting input is coupled to the input terminal, the non-inverting input is coupled to ground, and the amplifier output is coupled to the second output terminal. The capacitor is coupled between the inverting input and the amplifier output. The input of the non-inverting integrator is coupled to the amplifier output, and the integrator output is coupled to the first output terminal.

The filter circuit can be advantageously configured to provide either 2nd order low pass and band-pass frequency responses, 3rd order low pass or high pass frequency responses, or 2nd order band-pass and high pass frequency responses. The filter circuit can be configured to provide these responses by coupling at least three additional circuit elements (e.g., resistors) to the three terminals of the filter circuit. Moreover, the filter circuit can be manufactured to operate within a selected range of center frequencies. A user then can select a particular center frequency, quality factor, and gain by simply selecting particular values for the additional circuit elements. Furthermore, various types of higher order filters can be constructed by cascading filter circuits.

The invention also provides a configurable operational filter that includes a plurality of 3-terminal operational filter circuits fabricated preferably as an integrated circuit chip. The configurable filter can be easily configured to construct various types of active filters by simply coupling a few additional elements (i.e., resistors and capacitors) to the configurable filter.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention provides a building block active-RC filter circuit that can be used to construct various types of active filters of 2nd order or higher. The present invention advantageously requires few precision components, and can be used in many applications, including high resolution systems, anti-aliasing filters, smoothing or reconstruction filters, data communications, equalizers, dual I-and-Q channels, linear phase filtering, and replacement of LC filter modules.

Figure 1A:
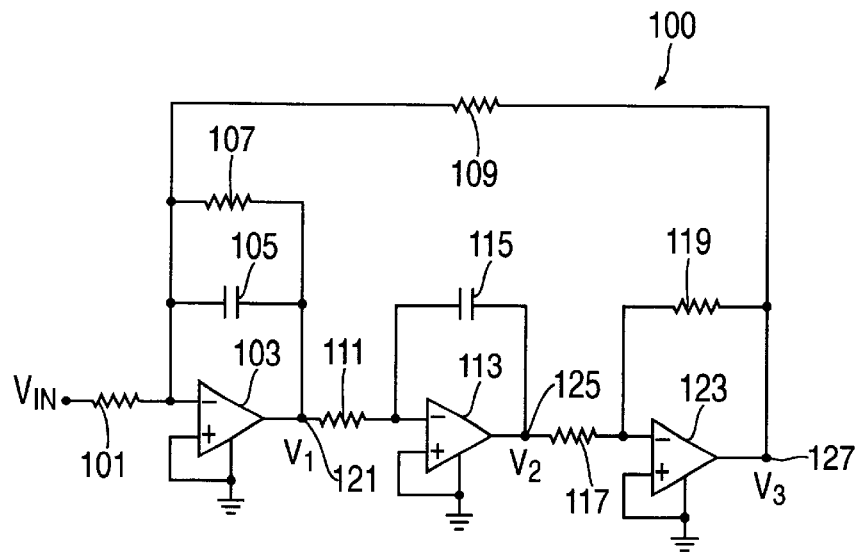
FIGS. 1A and 1B are block diagrams of known 2nd order filters.
Figure 1B:
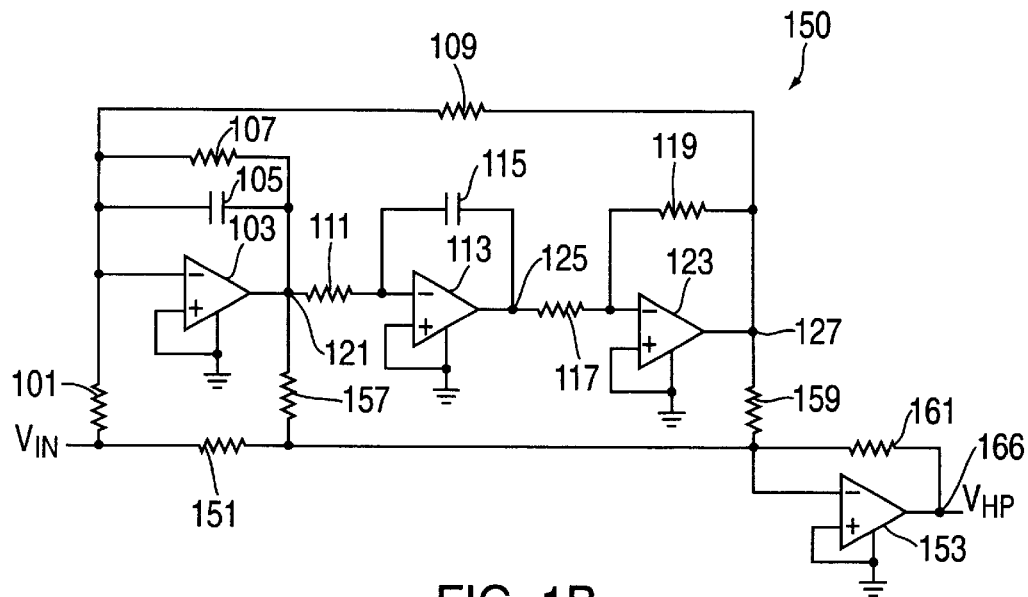
Figure 2:
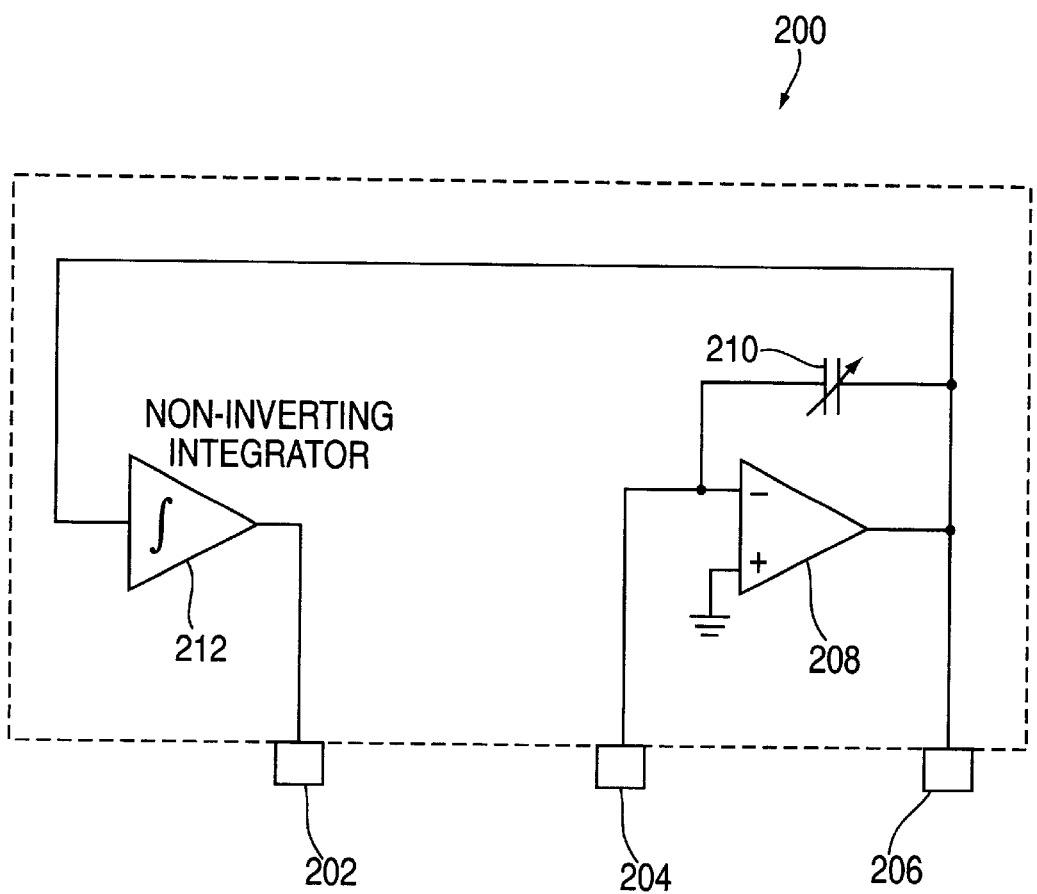
FIG. 2 is a block diagram of an exemplary embodiment of a 3-terminal operational filter circuit according to the present invention.

FIG. 2 shows an exemplary embodiment of a 3-terminal operational filter circuit 200 constructed in accordance with the present invention. Filter circuit 200 is preferably fabricated as an integrated circuit. However, filter circuit 200 can alternatively be packaged as a 3-terminal device with discrete components.

Filter circuit 200 includes three terminals, input terminal 204, which receives input signals; output terminal 202, which provides a first frequency response; and output terminal 206, which provides a second frequency response.

Filter circuit 200 further includes operational amplifier (op amp) circuit 208, which can be a commercially available part; filter capacitor 210, which is preferably a precision component and preferably variable; and non-inverting integrator 212. To power op amp circuit 208 and non-inverting integrator 212 (as is known in the art), filter circuit 200 also includes at least two terminals (not shown in FIG. 2) for coupling to power and ground.

Non-inverting integrator 212 performs the following function:

$$\frac{1}{s(R_{INTERNAL})(C_{INTERNAL})}$$

where $R_{INTERNAL}$ and $C_{INTEANAL}$ are the respective internal resistance and capacitance of filter circuit 200. The operator "s" is equal to jω, where j is the imaginary number $\sqrt{-1}$, and ω is the angular frequency, which is equal to $2\pi f$ (f is frequency).

Figure 3:
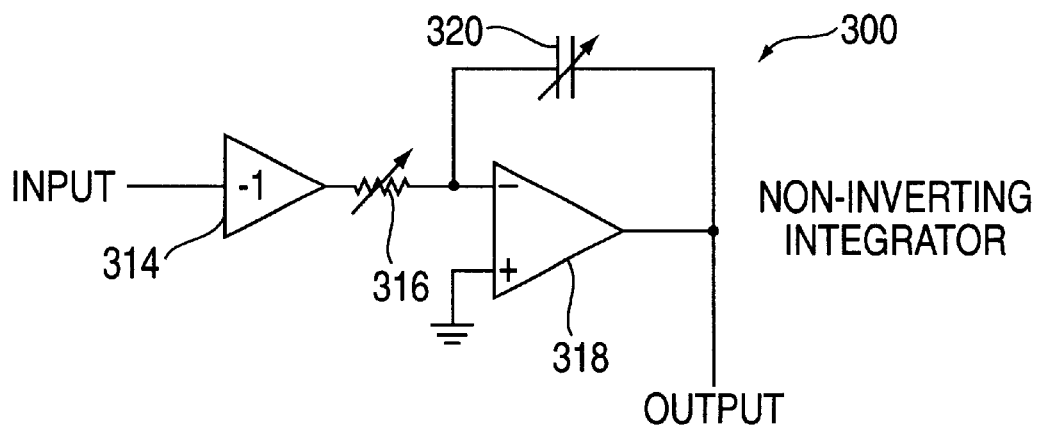
FIG. 3 is a block diagram of an exemplary embodiment of the non-inverting integrator of the filter circuit of FIG. 2 according to the present invention.

While non-inverting integrator 212 can be constructed in any known manner, an exemplary embodiment of non-inverting integrator 212 constructed in accordance with the present invention is shown in FIG. 3. Integrator 300 includes inverter 314, filter resistor 316, op amp circuit 318, and filter capacitor 320. Preferably, resistor 316 and capacitor 320 are each a precision element and preferably each are variable.

Figure 4:
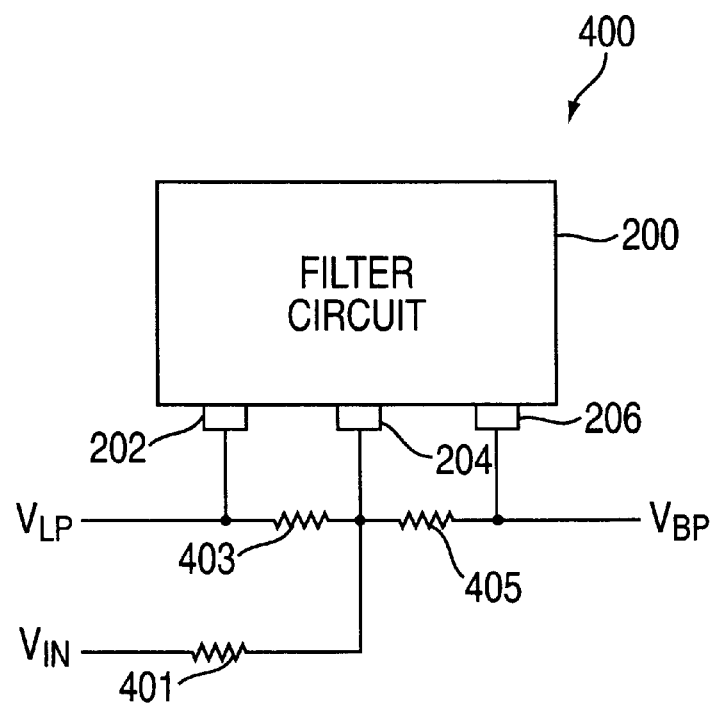
FIG. 4 is a block diagram of the filter circuit of FIG. 2 configured to provide 2nd order low pass and band-pass frequency responses according to the present invention.

Note that filter circuit 200 represents a portion of a 2nd order continuous-time filter. This advantageously permits filter circuit 200 to be easily configured to provide, for example, 2nd order low pass and band-pass frequency responses, 3rd order low pass or high pass frequency responses, or 2nd order band-pass and high pass frequency responses. For example, to provide 2nd order low pass and band-pass frequency responses, resistors 401, 403, and 405 are coupled to filter circuit 200 in accordance with the present invention as shown in FIG. 4. Low pass frequency response $V_{LP}$ is provided at output terminal 202, and band-pass frequency response $V_{BP}$ is provided at output terminal 206.

In contrast to known active-RC filters, which are typically manufactured with fixed center frequencies, filter circuit 200 can be advantageously manufactured with different ranges of center frequencies. As shown below, center frequency $f_o$ is a function of $C_{INTERNAL}$, $R_{INTERNAL}$, and resistor 403.

$$f_o = \frac{1}{2\pi\, C_{INTERNAL} \sqrt{R_{INTERNAL} R_{403}}}$$

Filter circuit 200 can therefore be manufactured with selected values for $R_{INTERNAL}$ and $C_{INTERNAL}$, which in the embodiments shown in FIGS. 2 and 3, are as follows:

$C_{INTERNAL} = \sqrt{C_{210} C_{320}}$ $R_{INTERNAL} = R_{316}$

A user can then fine tune filter circuit 200 to a particular center frequency within that range by selecting a particular value for resistor 403.

To be able to select various values for resistor 316 and capacitors 210 and 320, resistor 316 and capacitors 210 and 320 can each be fabricated as a parallel arrangement of fixed value elements and fusible metal links or switches (which is known in the art and not shown). Once the particular values of resistor 316 and capacitors 210 and 320 are determined, either the appropriate switches are closed or the appropriate links are blown by laser to set the determined values.

The range of center frequencies is limited mainly by the practical magnitude limits of resistor 403 and their effects on filter circuit 200. For example, if the value of resistor 316 is set to about 10k ohms and the value of $C_{INTERNAL}$ is set to about 159 pF, the resulting center frequency range is about 10k Hz to 150k Hz. This range corresponds to an upper resistor 403 limit of about 1M ohm ($f_o$=10k Hz), and a lower resistor 403 limit of about 4.4k ohms ($f_o$=150k Hz). However, because of increased output loading and increased THD (total harmonic distortion) effects that result from such a low valued resistor, the lower limit of resistor 403 is preferably at least 5k ohms.

Continuing with the above example, if a user requires a center frequency of about 100k Hz, solving for resistor 403 in the center frequency equation yields a value of about 10k ohms. Similarly, if another user required a center frequency of 50k Hz, resistor 403 should be about 40k ohms. This feature of filter circuit 200 advantageously accommodates users with differing filter requirements.

Returning to FIG. 4, the transfer functions of the low pass and band-pass responses of filter 400 are, respectively, $$H_{LP}(s) = \frac{-H_L \omega_o^2}{s^2 + (\omega_o/Q)s + \omega_o^2}$$

$$H_{BP}(s) = \frac{-H_B(\omega_o/Q)s}{s^2 + (\omega_o/Q)s + \omega_o^2}$$

where:

$$H_L(\text{low pass gain}) = \frac{R_{403}}{R_{401}}$$

$$H_B(\text{band-pass gain}) = \frac{R_{405}}{R_{401}}$$

$$Q = \frac{R_{405}}{\sqrt{R_{316} R_{403}}}$$

and $$\omega_o = 2\pi f_o$$

Thus, as shown above, the center frequency, quality factor, and gains of filter 400 can be easily set by selecting particular values for resistors 401, 403, and 405. Advantageously, no clocks, phase lock loops, digital signal processing, or tuning cycles are required to set these filter parameters.

Figure 5:
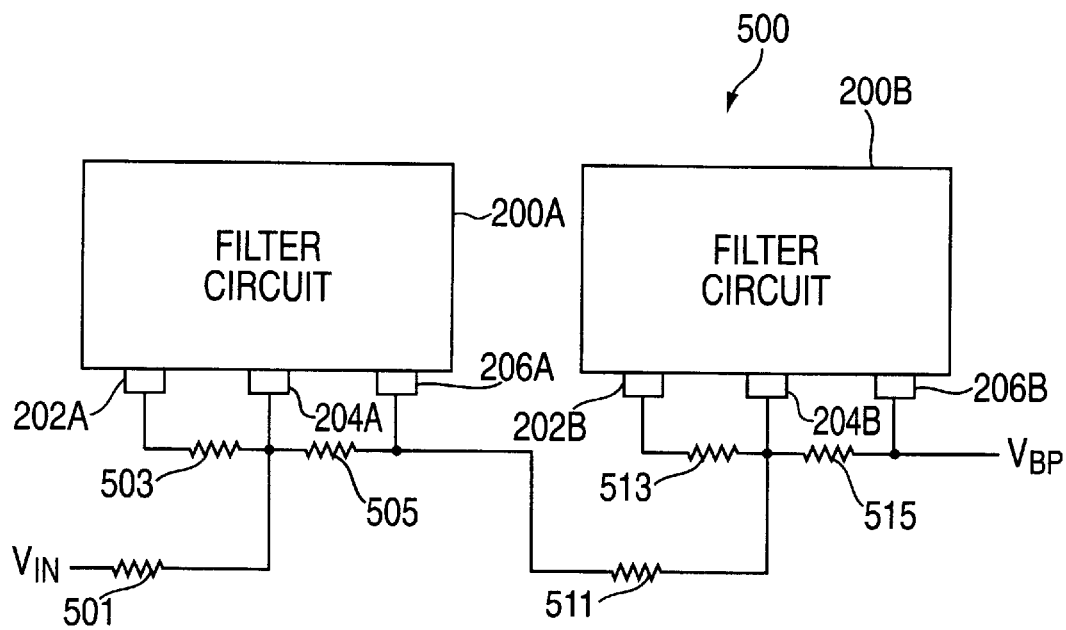
FIG. 5 is a block diagram of two of the filter circuits of FIG. 2 cascaded to provide a higher order response according to the present invention.

FIG. 5 shows two filter circuits 200 cascaded to advantageously construct a filter for higher order band-pass responses in accordance with the present invention. As shown, resistor 511 is simply coupled between the terminal 206A (the band-pass output) and input terminal 204B to cascade filter circuits 200A and 200B. Advantageously, filter 500 can be easily converted to a higher order low pass filter by simply coupling resistor 511 between terminals 202A and 204B instead of between terminals 206A and 204B.

The input of each filter circuit 200 is a virtual-ground summing point for a corresponding filter circuit 200. This gives each filter circuit 200 the capability to perform analog operations such as gain (preamplification), summing and weighting of multiple inputs, and directly accepting current or charge signals. Note that the transfer functions of filter 400 are inverting (indicated by the minus sign). Thus, when two filter circuits 200 are cascaded as shown in FIG. 5, these phase inversions cancel, and the resulting filter 500 is a non-inverting filter.

Figure 6:
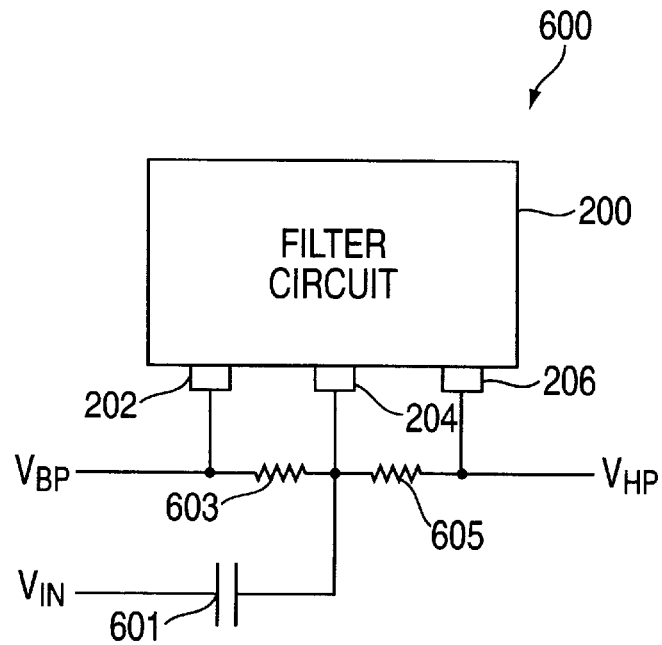
FIG. 6 is a block diagram of the filter circuit of FIG. 2 configured to provide 2nd order band-pass and high pass frequency responses according to the present invention.

To provide 2nd order band-pass and high pass frequency responses, capacitor 601 and resistors 603 and 605 are coupled to filter circuit 200 in accordance with the present invention as shown in FIG. 6. Note that filter 200 easily changes from a low pass filter to a high pass filter by simply replacing resistor 401 with capacitor 601. High pass frequency response $V_{HP}$ is provided at output terminal 206,and band-pass frequency response VBP is now provided at output terminal 202.

The band-pass transfer function of filter 600 is the same as the band-pass transfer function of filter 400. The high pass transfer function of filter 600 is as follows:

$$H_{HP}(s) = \frac{-H_H s^2}{s^2 + (\omega_o/Q)s + \omega_o^2}$$

where:

$$H_H \text{(high pass gain)} = \frac{C_{601}}{C_{INTERNAL}}$$

$$Q = \frac{R_{605}}{\sqrt{R_{316}R_{603}}}$$

$$\omega_o = 2\pi f_o$$

and $$f_o = \frac{1}{2\pi C_{INTERNAL}\sqrt{R_{INTERNAL}R_{603}}}$$

The replacement of resistor 401 with capacitor 601 modifies the band-pass gain of filter 600 as follows:

$$H_B\text{(band-pass gain)} = \frac{R_{605}}{R_{316}}\frac{C_{601}}{C_{INTERNAL}}$$

Again, $C_{INTERNAL}$ is the internal capacitance of filter 200, which in the embodiments of filter circuit 200 and integrator 300 shown respectively in FIGS. 2 and 3 is $$C_{INTERNAL} = \sqrt{C_{210}C_{320}}$$

Note that the replacement of resistor 401 with capacitor 601 affects only the gains. Thus, if resistors 603 and 605 are respectively equal to resistors 403 and 405, the center frequencies and quality factors of filters 600 and 400 are equal.

To configure higher order high pass filters, filter circuit 600 can be similarly cascaded as filter circuit 500, except that resistors 501 and 511 are replaced with capacitors.

Figure 7:
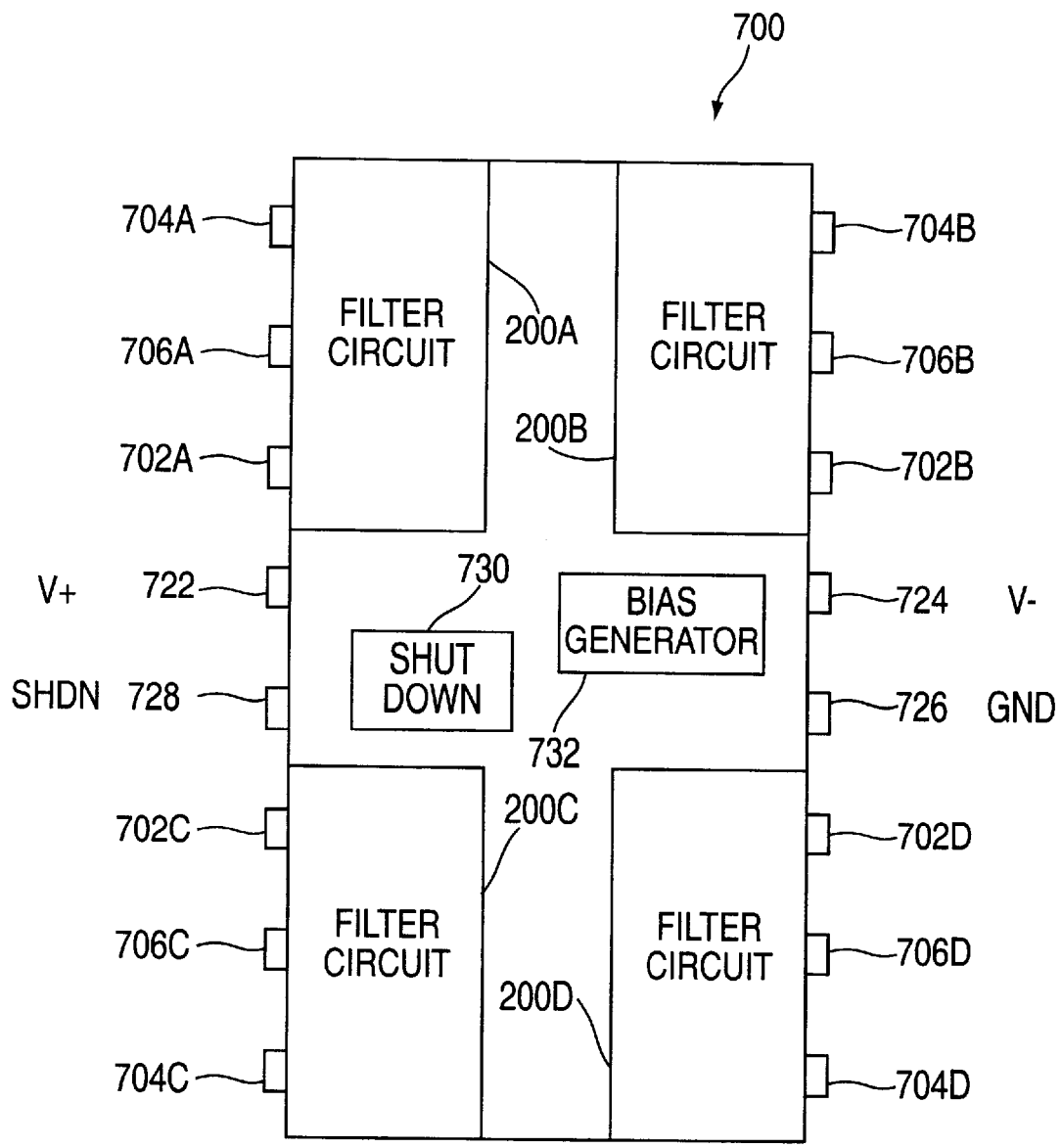
FIG. 7 is a block diagram of an exemplary embodiment of a configurable operational filter constructed with the filter circuit of FIG. 2 according to the present invention.

FIG. 7 shows an exemplary embodiment of a configurable operational filter constructed with a plurality of filter circuits 200 in accordance with the present invention. Configurable filter 700 is preferably fabricated as an integrated circuit chip. However, configurable filter 700 can be alternatively constructed as a discrete component device.

Configurable filter 700 includes filter circuits 200A–D having input terminals 704A–D and output terminals 702A–D and 706A–D, respectively. Filters of up to 12th order (i.e., twelve poles, another mathematical concept related to the transfer function) can be configured with configurable filter 700. Note that while four filter circuits 200 are shown in FIG. 7 for illustrative purposes, other numbers of filter circuits 200 can be used to construct configurable filter 700.

Configurable filter 700 also includes voltage input terminal 722 for preferably receiving a positive voltage V+, voltage input terminal 724 for preferably receiving a negative voltage V−, and ground terminal 726 for coupling to a DC or AC ground. Preferably, voltage input terminals 722 and 724 are each bypassed with 0.1 µF capacitors to AC ground (as shown in FIGS. 10–13).

Ground terminal 726 is coupled to an internal node of configurable filter 700 (not shown), which is the midpoint of a resistive voltage divider between voltage input terminals 722 and 724. This results in a half-supply voltage that serves as an internal ground reference that advantageously permits configurable filter 700 to operate with single or dual supply voltages. For dual supply operation, ground terminal 726 is coupled to an AC or DC ground. For single supply operation, voltage input terminal 724 (V−) is coupled to system ground (the ground of the system using configurable filter 700). Ground terminal 726 is bypassed with at least a 0.1 µF capacitor to the system ground at voltage input terminal 724 (V−). The internal ground reference establishes a reference voltage for the input and output signals in single supply operation.

Configurable filter 700 preferably includes shutdown terminal 728 and shutdown circuitry 730. Shutdown circuitry 730 is coupled to shutdown terminal 728, voltage terminals 722 and 724, and filter circuits 200A–D. (For clarity, these connections are not shown in FIG. 7; furthermore, because shutdown circuity 730 can be implemented by persons of ordinary skill in the art in accordance with the following description, shutdown circuitry 730 is not shown). Shutdown circuitry 730 drives configurable filter 700 into a shutdown state when shutdown terminal 728 is not receiving a logical 0 signal. In other words, if shutdown terminal 728 receives a logical 1 signal, or is left open-circuited, shutdown circuitry 730 generates two disable signals OFF and OFFB that disable bias generator 732 and filter circuits 200A–D. This causes ground terminal 726 and output terminals 702A–D and 706A–D to enter a high impedance state, A small pull-up current source at shutdown terminal 728 defaults configurable filter 700 to the shutdown state when shutdown terminal 728 is left open-circuited.

Figure 8:
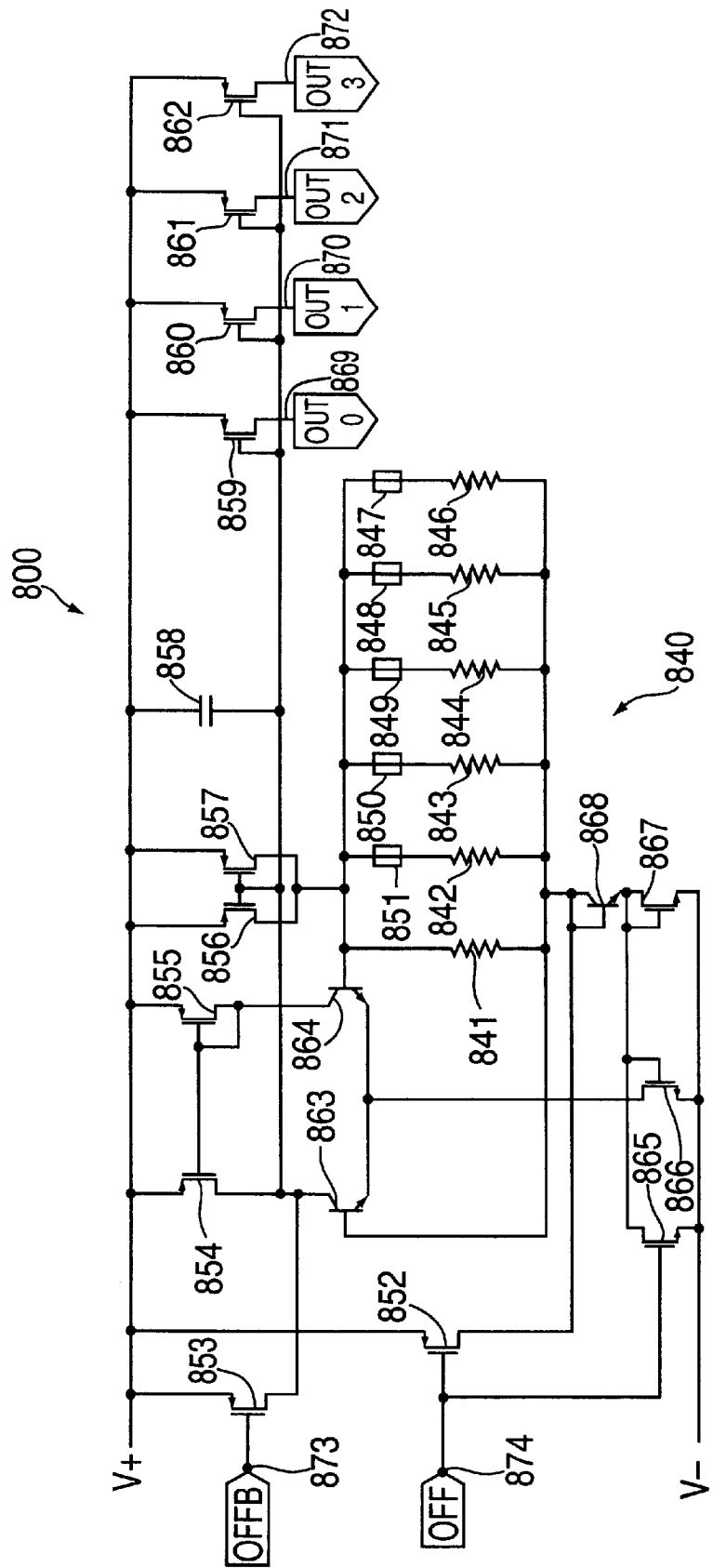
FIG. 8 is a circuit diagram of an exemplary embodiment of the bias generator of the configurable filter of FIG. 7 according to the present invention.

Configurable filter 700 also preferably includes bias generator 732, which biases filter circuits 200A–D (for clarity, connections to and from bias generator 732 are not shown in FIG. 7). FIG. 8 shows an exemplary embodiment of bias generator 732 in accordance with the present invention. Bias generator 800 preferably includes a 5-bit programmable binary resistor array 840 to control the supply current of configurable filter 700. Resistor array 840 adjusts for process variations and advantageously permits fabrication of lower power versions of configurable filter 700. Resistor array 840 includes weighted resistors 841–846 and fuses 847–851. Resistors 841–846 are preferable weighted as follows: resistor 842 is 2× resistor 843,resistor 843 is 2× resistor 844, resistor 844 is 2× resistor 845,and resistor 845 is 2× resistor 846. Fuses 847–851 are preferably laser-fusible.

Bias generator 800 also includes PMOS transistor 852, which is preferably a long channel device that preferably provides a few microamperes of startup current to enable bias generator 800 to be DC self-starting under all conditions. Bias generator 800 further includes PMOS transistors 853–857 and 859–862; NPN transistors 863, 864,and 868; NMOS transistors 865–867;and capacitor 858. Output nodes 869–872 are respectively coupled to filter circuits 200A–D, and outputs OUT0–3 respectively supply bias current to filter circuits 200A–D. Signals OFFB and OFF received at respective nodes 873, 874 are generated by shutdown circuitry 730.

Figure 9:
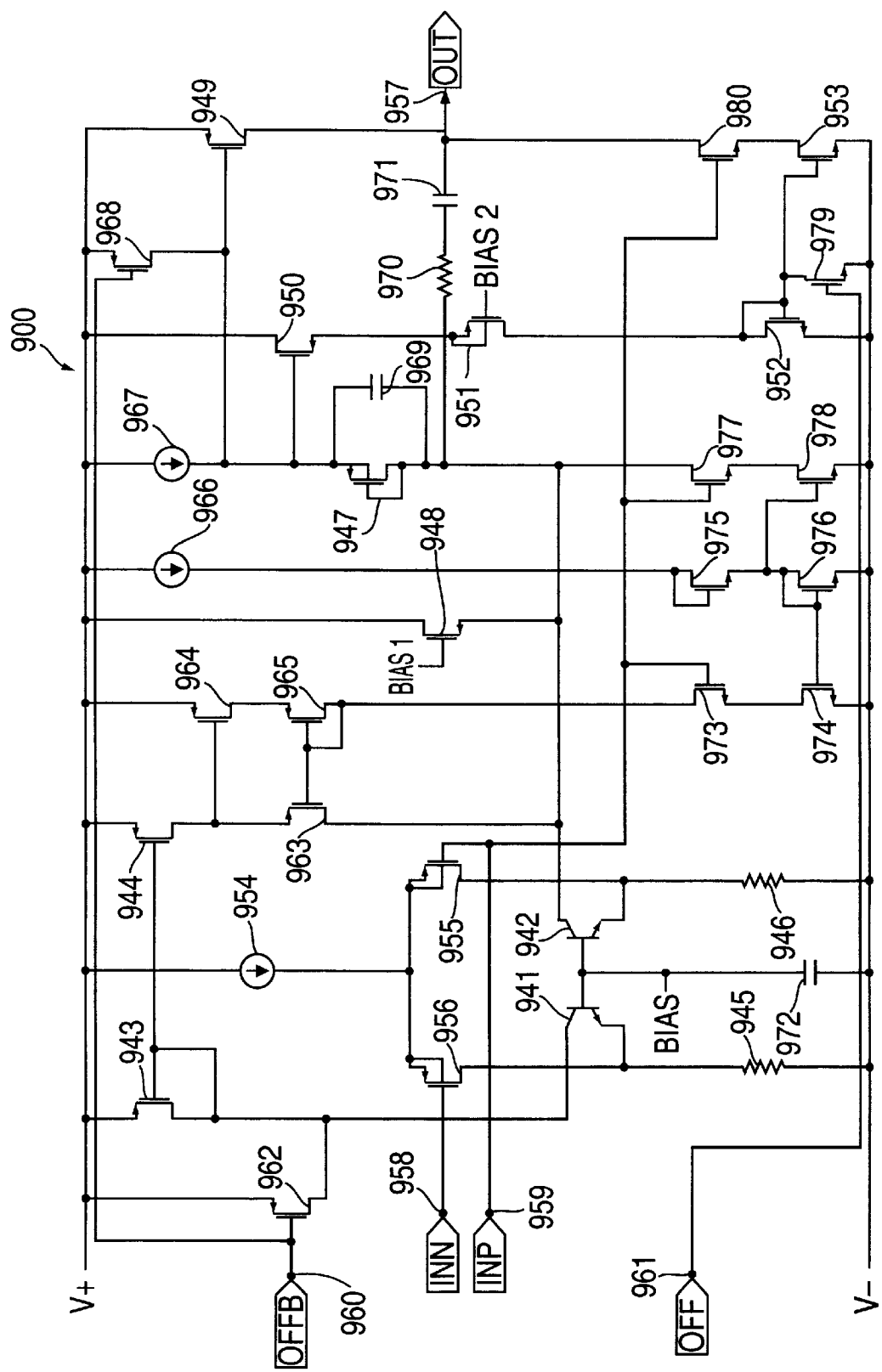
FIG. 9 is a circuit diagram of an exemplary embodiment of the operational amplifier of the filter circuit of FIG. 2 and the operational amplifier and inverter of the non-inverting integrator of FIG. 3 according to the present invention.

FIG. 9 shows an exemplary embodiment of operational amplifier circuitry preferably used to construct inverter 314 and operational amplifiers 208 and 318 in accordance with the present invention. Operational amplifier (op-amp) circuit 900 includes output node 957,inverting input node 958,and non-inverting input node 959. Nodes 960 and 961 respectively receive signals OFFB and OFF generated by shutdown circuitry 730.

Op amp circuit 900 is preferably an N-well CMOS circuit that advantageously does not use NMOS devices in the high gain portion of the signal path because of their inferior 1/f noise. Instead, N-well isolated NPN transistors 941, 942 form a folded-cascode stage feeding high impedance PMOS current mirror 943, 944, 963, 964, 965. Resistors 945, 946 behave like current sources and are not a significant source of noise. PMOS transistor 947 is a level shift device that permits a convenient DC level at the first stage output (the collector of NPN transistor 942), and NPN transistor 948 is a clamp for rapid overload recovery driven by signal BIAS1.

Signals BIAS1 and BIAS2 are outputs of circuitry described in commonly-owned U. S. Patent Application Ser. No. 09/113,618 filed Jul. 10, 1998, which is hereby incorporated by reference herein in its entirety.

The output stage includes PMOS transistors 949 and 951 and NMOS transistors 950, 952, and 953. NMOS transistor 950 and PMOS transistor 951 operate together as a composite NMOS device whose source voltage is set by signal BIAS2 on the gate of PMOS transistor 951, and whose equivalent "k" or $g_m$ (transconductance) parameter relates directly to those of NMOS transistor 950 and PMOS transistor 951. NMOS transistors 952, 953 form a 1:8 current mirror that draws the resulting drain current and combines it with that of PMOS transistor 949 in proper polarity. This arrangement allows the output devices to swing rail-to-rail (the signal voltage range including the power supplies), but also causes the large-signal non-linearities of the PMOS and NMOS output paths to cancel. Signal BIAS2 drives the gate of PMOS transistor 951 such that PMOS transistor 949 and NMOS transistor 950 operate with the same quiescent gate voltage.

This open loop linear output stage prevents additional distortion at signal frequencies, where the overall loop gain is reduced. The output stage operates in class-A push-pull until the load current exceeds its quiescent current in either direction, and then the output stage makes a smooth symmetrical transition to class-AB with higher efficiency. Filter circuit 200 can therefore be programmed for lower current operation at a cost of increased distortion.

At the input stage of op amp circuit 900, a tradeoff exists between distortion and noise. With a unity gain frequency $\omega_u$ and a given input-pair current source 954, sizing input PMOS transistors 955, 956 affects distortion and noise in opposite directions. (A high ratio of op amp slew rate to signal slew rate reduces distortion. Slew rate is a time rate of change of, for example, an output voltage under specified conditions.) Preferably, noise is favored in this tradeoff, because noise is the limiting factor in the dynamic range of signals that the filter can process.

FIGS. 10–13 show exemplary embodiments of several types of active-RC filters constructed with configurable filter 700 in accordance with the present invention (for clarity, shutdown circuitry 730 and bias generator 732 are not shown in FIGS. 10–13).

Figure 10:
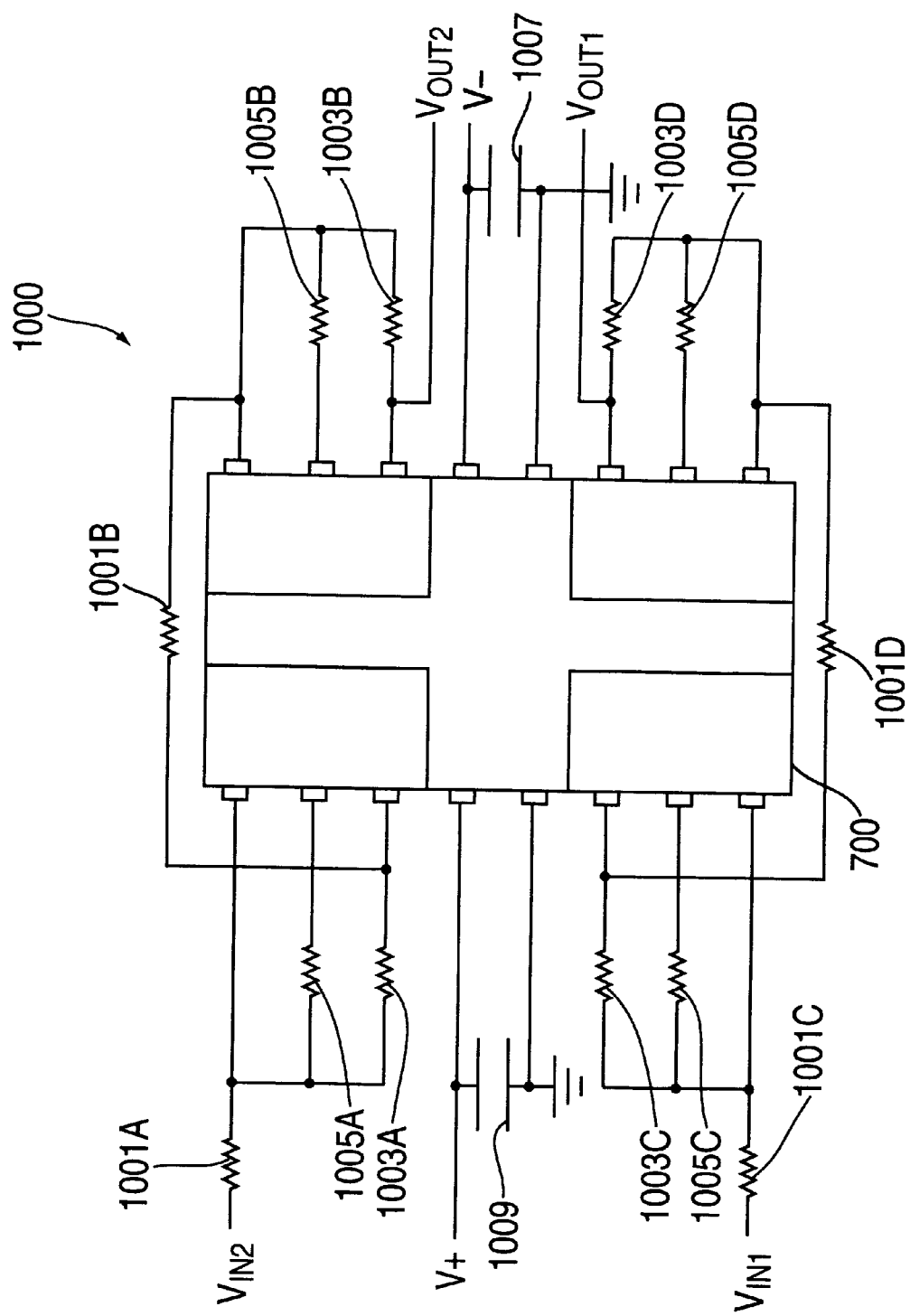
FIG. 10 is a block diagram of an exemplary embodiment of a dual 4th order low pass filter constructed with the configurable filter of FIG. 7 according to the present invention.
Figure 11:
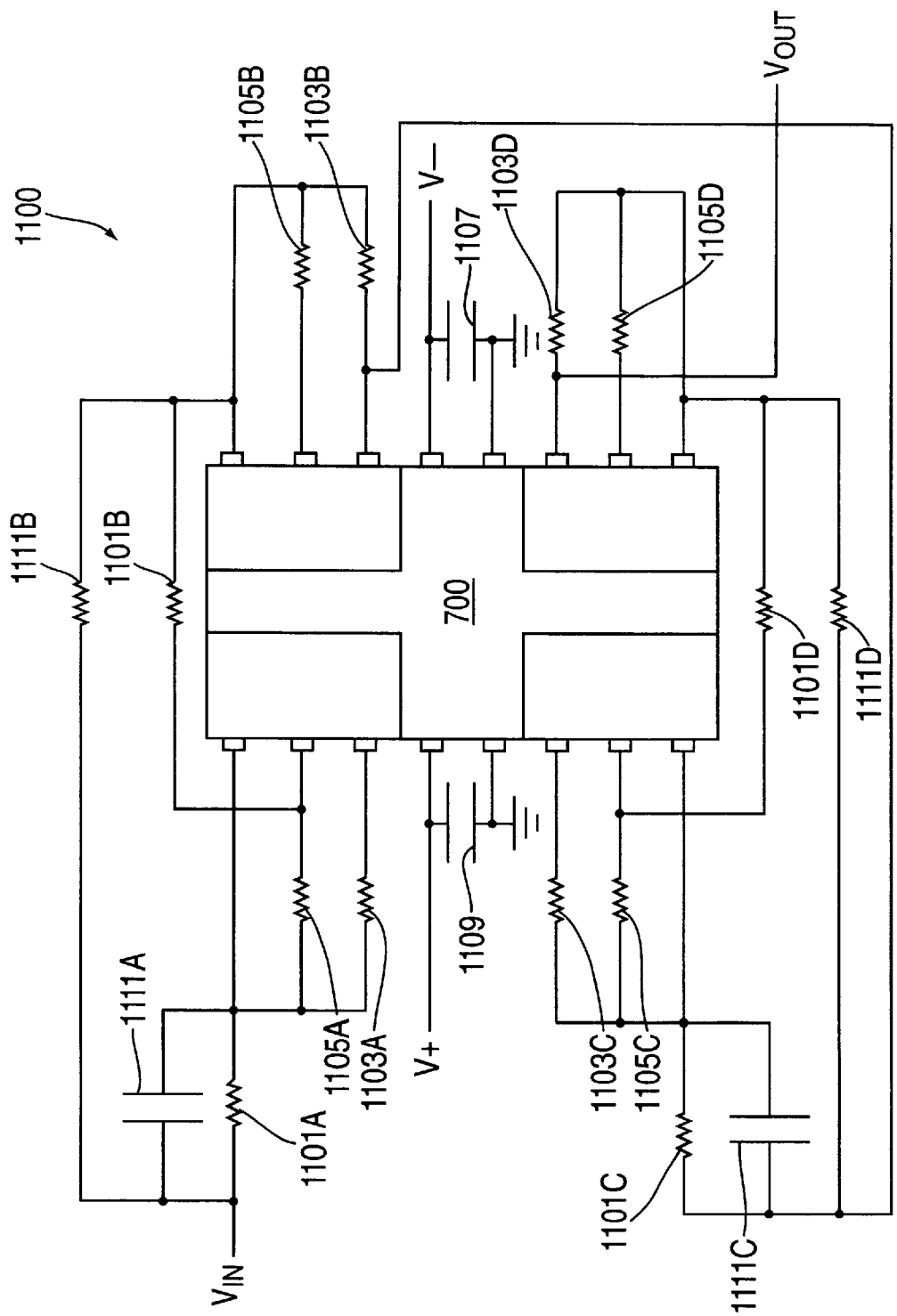
FIG. 11 is a block diagram of an exemplary embodiment of an 8th order low pass elliptic filter constructed with the configurable filter of FIG. 7 according to the present invention.
Figure 12:
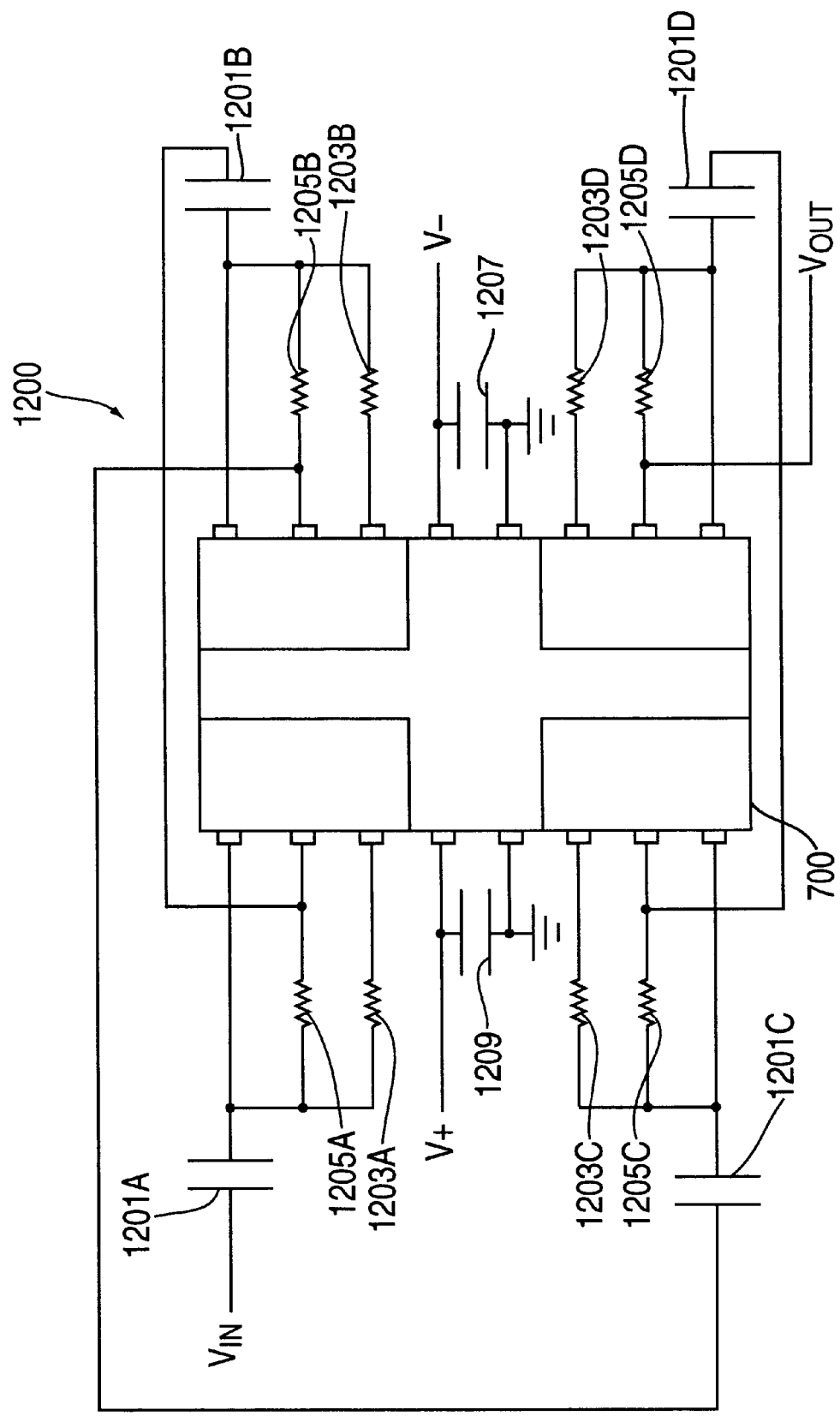
FIG. 12 is a block diagram of an exemplary embodiment of an 8th order high pass filter constructed with the configurable filter of FIG. 7 according to the present invention.
Figure 13:
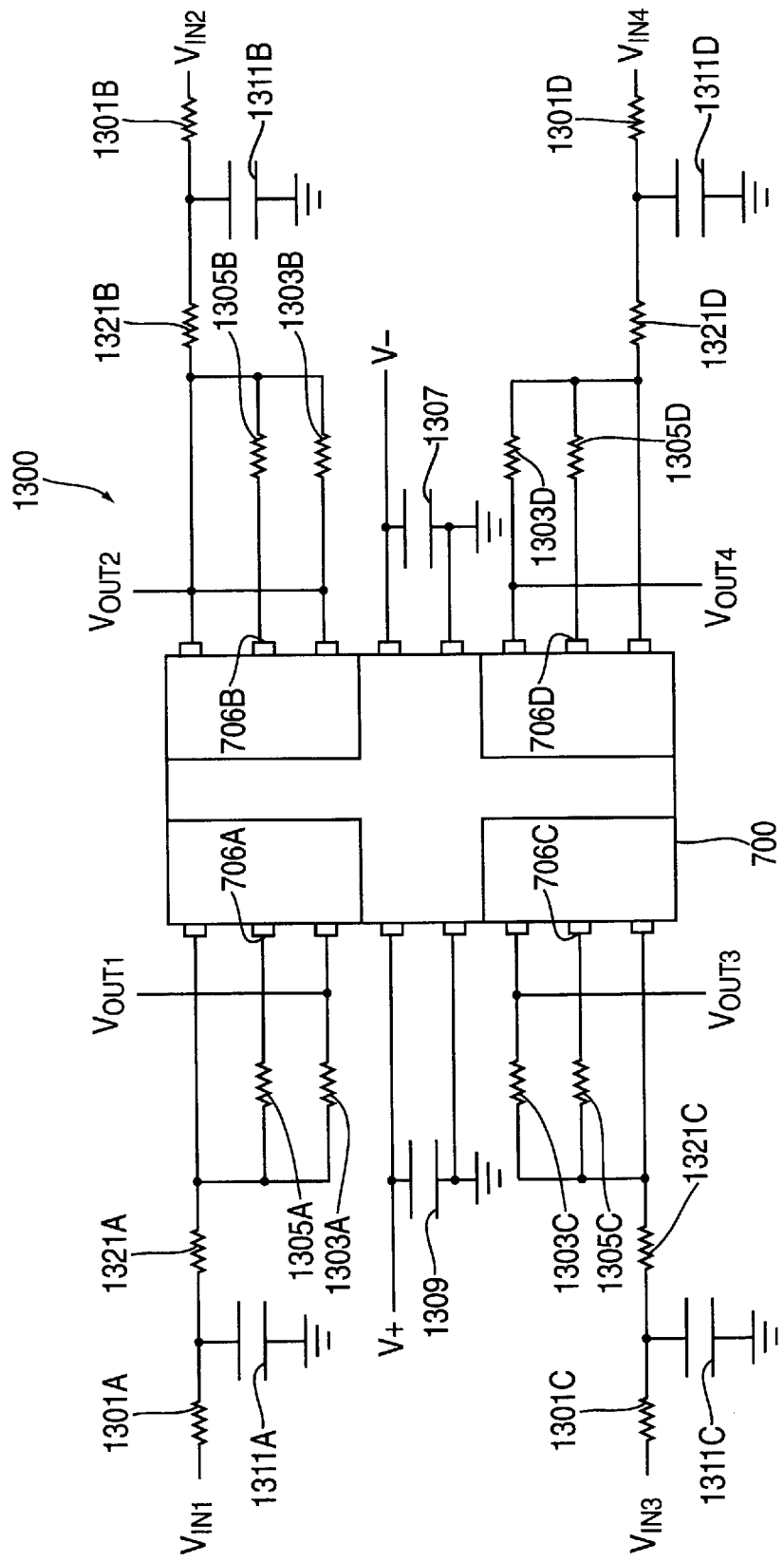
FIG. 13 is a block diagram of an exemplary embodiment of a quadruple 3rd order low pass filter constructed with the configurable filter of FIG. 7 according to the present invention.

FIG. 10 shows an exemplary embodiment of a dual 4th order 100k Hz Butterworth low pass filter 1000 constructed with configurable filter 700. A Butterworth filter provides a maximally-flat passband frequency response. Each half of filter 1000 provides a unity-passband-gain low pass response. The positive voltage V+ is preferably about 5 volts and the negative voltage V− is preferably about −5 volts. The circuit elements of filter 1000 are preferably about as follows:

resistor 1001A 10k ohms
  resistor 1005A=5.62k ohms
  resistor 1003A=10k ohms
  resistor 1001B=10k ohms
  resistor 1005B=13k ohms
  resistor 1003B=10k ohms
  resistor 1001C×10k ohms
  resistor 1005C=5.62k ohms
  resistor 1003C=10k ohms
  resistor 1001D=10k ohms
  resistor 1005D=13k ohms
  resistor 1003D=10k ohms
  capacitor 1007=0.1 µF
  capacitor 1009=0.1 µF FIG. 11 shows an exemplary embodiment of an 8th order 100k Hz low pass elliptic filter 1100 constructed with configurable filter 700. Filter 1100 includes additional capacitors 1111A and 1111C in the input path, and sums these parallel resistor-capacitor paths at input terminals 704A–D to produce two notches in the low pass stopband (the band of frequencies filtered out). The positive voltage V+ is preferably bout 5 volts and the negative voltage V− is preferably bout −5 volts. The circuit elements of filter 1100 re preferably about as follows:

resistor 1101=19.6k ohms
  capacitor 1111A=87 pF
  resistor 1105A=13k ohms
  resistor 1103A=8.87k ohms
  resistor 1101B=8.06k ohms
  resistor 1111B=12.1k ohms
  resistor 1105B=8.78k ohms
  resistor 1103B=12.1k ohms
  resistor 1101C=69.8k ohms
  capacitor 1111C=47 pF
  resistor 1105C=28k ohms
  resistor 1103C=8.78k ohms
  resistor 1001D=7.32k ohms
  resistor 1111D=17.8k ohms
  resistor 1105D=6.98k ohms
  resistor 1103D=17.8k ohms
  capacitor 1107=0.1 µF
  capacitor 1109=0.1 µF FIG. 12 shows an exemplary embodiment of an 8th order Chebyshev high pass filter 1200 with about 0.05 dB ripple and a cutoff frequency of about 30k Hz constructed with configurable filter 700. Ripples are increases and decreases in gain within the passband (the range of frequencies allowed to pass through the filter). Each of the four cascaded filter circuits 200A–D has an external capacitor in the input path (capacitors 1201A–D). Resistors 1203A–D and 1205A–D set the respective center frequency and quality factor of filter circuits 200A–D. The positive voltage V+ is preferably about 5 volts and the negative voltage V− is preferably about −5 volts. The circuit elements of filter 1200 are preferably about as follows:

capacitor 1201A=150 pF
  resistor 1205A=10.2k ohms
  resistor 1203A=35.7k ohms
  capacitor 1201B=150 pF
  resistor 1205B=22.1k ohms
  resistor 1203B=66.5k ohms
  capacitor 1201C=150 pF
  resistor 1205C=54.9k ohms
  resistor 1203C=107k ohms
  capacitor 1201D=150 pF resistor 1205D=98.9k ohms resistor 1203D=127k ohms capacitor 1207=0.1 µF capacitor 1209=0.1 µF FIG. 13 shows an exemplary embodiment of quadruple 3rd order 100k Hz Butterworth low pass filter 1300 constructed with configurable filter 700. Filter 1300 illustrates the flexibility of the virtual-ground inputs by permitting an extra, independent real pole to be added by replacing the input resistor (e.g., resistor 401 of FIG. 4) with an R-C-R "T" network. As shown in FIG. 13, the input resistor is split into two parts (resistors 1301A–D and 1321A–D). This parallel combination forms a 100k Hz real pole (for the values shown below) with external capacitors 1311A–D. As shown, four such 3rd order Butterworth low pass filters can be constructed with configurable filter 700 for a total of twelve poles. The same technique can advantageously add additional real poles to other filter configurations as well, such as, for example, modifying dual 4th order low pass filter 1000 to produce a dual 5th order or dual 6th order filter. The positive voltage V+ of filter 1300 is preferably about 5 volts and the negative voltage V– is preferably about –5 volts. The circuit elements are preferably about as follows:

resistor 1301A=6.19k ohms capacitor 1311A=680 pF resistor 1321A=3.83k ohms resistor 1305A=10k ohms resistor 1303A=10k ohms resistor 1301B=6.19k ohms capacitor 1311B=680 pF resistor 1321B=3.83k ohms resistor 1305B=10k ohms resistor 1303B=10k ohms resistor 1301C=6.19k ohms capacitor 1311C=680 pF resistor 1321C=3.83k ohms resistor 1305C=10k ohms resistor 1303C=10k ohms resistor 1301D=6.19k ohms capacitor 1311D=680 pF resistor 1321D=3.83k ohms resistor 1305D=10k ohms resistor 1303D=10k ohms capacitor 1307=0.1 µF capacitor 1309=0.1 µF Note that an exemplary embodiment of a quadruple 3rd order high pass filter can be constructed with filter 1300 simply by replacing resistors 1301A–D and 1321A–D with capacitors, and by replacing capacitors 1311A–D with resistors. The high pass outputs are then provided at terminals 706A–D of configurable filter 700.

Thus it is seen that a 3-terminal operational filter circuit is provided that can be easily configured into various types of active filters. One skilled in the art will appreciate that the present invention can be practiced by other than the described embodiments, which are presented for purposes of illustration and not of limitation, and the present invention is limited only by the claims which follow.

What is claimed is:

1. A 3-terminal operational filter circuit comprising:

an input terminal for receiving an input signal from an input signal source;

a first output terminal that provides a first frequency response in response to a first condition, said first condition comprising a resistor coupled in series between said input terminal and said input signal source, said first output terminal providing a second frequency response in response to a second condition, said second condition comprising a capacitor coupled in series between said input terminal and said input signal source;

a second output terminal that provides said second frequency response in response to said first condition and that provides a third frequency response in response to said second condition;

an operational amplifier having an inverting input, a non-inverting input, and an amplifier output, said inverting input coupled to said input terminal, said non-inverting input coupled to ground, and said amplifier output coupled to said second output terminal;

a capacitor coupled in series between said inverting input and said amplifier output; and a non-inverting integrator having an integrator input and an integrator output, said integrator input coupled to said amplifier output, and said integrator output coupled to said first output terminal; wherein:

said first, second, and third frequency responses are each selected from the group consisting of low pass, band-pass, and high pass frequency responses.

2. The filter circuit of claim 1 wherein said non-inverting integrator comprises:

an inverter having an inverter input and an inverter output, said inverter input being said integrator input;

a resistor coupled in series between said inverter output and a node;

an operational amplifier having an inverting input, a non-inverting input, and an amplifier output, said inverting input coupled to said node, said non-inverting input coupled to ground, and said amplifier output being said integrator output; and a capacitor coupled between said inverting input of said amplifier of said integrator and said integrator output.

3. The filter circuit of claim 2 wherein said filter circuit has a selectable range of center frequencies based on values selected for said resistor and said capacitor of said non-inverting integrator and said capacitor coupled in series between said inverting input and said amplifier output, said filter circuit tunable to a center frequency within said range in accordance with a value of a resistor coupled in series between said first output terminal and said input terminal.

4. The filter circuit of claim 1 wherein said filter circuit is an integrated circuit.

5. The filter circuit of claim 1 further comprising:

a first resistor coupled between said first output terminal and said input terminal;

a second resistor coupled between said input terminal and said second output terminal; and a third resistor coupled between said input terminal and an input signal source; wherein said first output terminal provides a 2nd order low pass frequency response and said second output terminal provides a 2nd order band-pass frequency response.

6. The filter circuit of claim 5 wherein said filter circuit has a selectable center frequency based on a value of said first resistor.

7. The filter circuit of claim 5 wherein said filter circuit has a selectable center frequency, quality factor, low pass gain, and band-pass gain based on values of said first, second, and third resistors.

8. The filter circuit of claim 1 further comprising:
a first resistor coupled between said first output terminal and said input terminal;
a second resistor coupled between said input terminal and said second output terminal; and
a capacitor coupled between said input terminal and an input signal source; wherein
said first output terminal provides a 2nd order band-pass frequency response and said second output terminal provides a 2nd order high pass frequency response.

9. The filter circuit of claim 8 wherein said filter circuit has a selectable center frequency based on a value of said first resistor.

10. The filter circuit of claim 8 wherein said filter circuit has a selectable center frequency, quality factor, band-pass gain, and high pass gain based on values of said first and second resistors and said capacitor coupled between said input terminal and an input signal source.

11. A configurable operational filter comprising:
a first voltage input terminal for coupling to a positive voltage supply;
a second voltage input terminal for coupling to a negative voltage supply;
a ground terminal for coupling to ground; and
a plurality of 3-terminal operational filter circuits each coupled to said first and second voltage input terminals and to said ground terminal, each one of said plurality of filter circuits comprising:
  an input terminal for receiving an input signal from an input signal source,
  a first output terminal that provides a first frequency response in response to a first condition, said first condition comprising a resistor coupled in series between said input terminal and said input signal source, said first output terminal providing a second frequency response in response to a second condition, said second condition comprising a capacitor coupled in series between said input terminal and said input signal source,
  a second output terminal that provides said second frequency response in response to said first condition and that provides a third frequency response in response to said second condition,
  an operational amplifier circuit having an inverting input, a non-inverting input, and an amplifier output, said inverting input coupled to said input terminal, said non-inverting input coupled to ground, and said amplifier output coupled to said second output terminal,
  a capacitor coupled in series between said inverting input and said amplifier output, and
  a non-inverting integrator having an integrator input and an integrator output, said integrator input coupled to said amplifier output, and said integrator output coupled to said first output terminal; wherein:
    said first, second, and third frequency responses are each selected from the group consisting of low pass, band-pass, and high pass frequency responses.

12. The configurable filter of claim 11 further comprising a bias generator coupled to said first and second voltage terminals and to said plurality of filter circuits for biasing said filter circuits.

13. The configurable filter of claim 11 wherein said non-inverting integrator comprises:

an inverter having an inverter input and an inverter output, said inverter input being said integrator input;
a resistor coupled in series between said inverter output and a node;
an operational amplifier having an inverting input, a non-inverting input, and an amplifier output, said inverting input coupled to said node, said non-inverting input coupled to ground, and said amplifier output being said integrator output; and
a capacitor coupled between said inverting input of said amplifier of said integrator and said integrator output.

14. The configurable filter of claim 13 wherein at least one of said plurality of filter circuits has a selectable range of center frequencies based on values selected for said resistor and said capacitor of said non-inverting integrator and said capacitor coupled in series between said inverting input and said amplifier output, said at least one of said plurality of filter circuits tunable to a center frequency within said range in accordance with a value of a resistor coupled in series between said first output terminal and said input terminal of said at least one filter circuit.

15. The configurable filter of claim 11 wherein said configurable filter is an integrated circuit.

16. The configurable filter of claim 11 further comprising:
a shutdown terminal; and
shutdown circuitry coupled to said shutdown terminal, to said first and second input voltage terminals, and to said plurality of filter circuits; wherein
said shutdown circuitry disables said plurality of filter circuits when said shutdown terminal receives a shutdown signal.

17. The configurable filter of claim 11 further comprising:
a first resistor coupled between said first output terminal of a first filter circuit of said plurality of filter circuits and said input terminal of said first filter circuit;
a second resistor coupled between said input terminal of said first filter circuit and said second output terminal of said first filter circuit;
a third resistor coupled between said input terminal of said first filter circuit and an input signal source;
a fourth resistor coupled between said first output terminal of said first filter circuit and said input terminal of a second filter circuit of said plurality of filter circuits;
a fifth resistor coupled between said first output terminal of said second filter circuit and said input terminal of said second filter circuit; and
a sixth resistor coupled between said input terminal of said second filter circuit and said second output terminal of said second filter circuit; wherein
said first output terminal of said second filter circuit provides a 4th order low pass frequency response.

18. The configurable filter of claim 11 further comprising:
a first resistor coupled between said first output terminal of a first filter circuit of said plurality of filter circuits and said input terminal of said first filter circuit;
a second resistor coupled between said input terminal of said first filter circuit and said second output terminal of said first filter circuit;
a first capacitor coupled between said input terminal of said first filter circuit and an input signal source;
a second capacitor coupled between said second output terminal of said first filter circuit and said input terminal of a second filter circuit of said plurality of filter circuits;

a third resistor coupled between said first output terminal of said second filter circuit and said input terminal of said second filter circuit;

a fourth resistor coupled between said second output terminal of said second filter circuit and said input terminal of said second filter circuit;

a third capacitor coupled between said second output terminal of said second filter circuit and said input terminal of a third filter circuit of said plurality of filter circuits;

a fifth resistor coupled between said first output terminal of said third filter circuit and said input terminal of said third filter circuit;

a sixth resistor coupled between said second output terminal of said third filter circuit and said input terminal of said third filter circuit;

a fourth capacitor coupled between said second output terminal of said third filter circuit and said input terminal of a fourth filter circuit of said plurality of filter circuits;

a seventh resistor coupled between said first output terminal of said fourth filter circuit and said input terminal of said fourth filter circuit; and an eighth resistor coupled between said second output terminal of said fourth filter circuit and said input terminal of said fourth filter circuit; wherein said second output terminal of said fourth filter circuit provides an 8th order high pass frequency response.

19. A method of constructing a 3-terminal filter circuit to electrically filter an input signal from an input signal source, said filter circuit comprising an input terminal, a first output terminal, and a second output terminal, said method comprising:

coupling an inverting input of an operational amplifier to said input terminal;

coupling an output of said amplifier to said first output terminal;

coupling a capacitor in series between said inverting input and said amplifier output;

coupling an input of a non-inverting integrator to said amplifier output; and coupling an output of said integrator to said second output terminal; wherein said filter circuit provides:

a first frequency response at said first output terminal and a second frequency response at said second output terminal in response to a first condition, said first condition comprising a resistor coupled in series between said input terminal and said input signal source;

a third frequency response at said first output terminal and said first frequency response at said second output terminal in response to a second condition, said second condition comprising a capacitor coupled in series between said input terminal and said input signal source; and wherein said first, second, and third frequency responses are each selected from the group consisting of low pass, band-pass, and high pass frequency responses.

20. The method of claim 19 further comprising:

coupling a resistor in series between said input and first output terminals;

coupling a resistor in series between said input and second output terminals; and coupling a resistor in series between an input signal source and said input terminal; wherein:

said band-pass response is provided at said first output terminal and said low pass response is provided at said second output terminal.

21. The method of claim 20 further comprising replacing said resistor coupled in series between an input signal source and said input terminal with a capacitor, wherein said high pass response is provided at said first output terminal and said band-pass response is provided at said second output.

22. The method of claim 19 further comprising:

coupling a resistor in series between said input and first output terminals;

coupling a resistor in series between said input and second output terminals; and coupling a capacitor in series between an input signal source and said input terminal; wherein:

said high pass response is provided at said first output terminal and said band-pass response is provided at said second output terminal.

23. A method of configuring a 3-terminal filter circuit to provide one of first and second sets of filter responses, said first set of filter responses including low pass and band-pass responses and said second set of responses including high pass and band-pass responses, said filter circuit comprising an input terminal, a first output terminal, a second output terminal, an operational amplifier coupled between said input terminal and said second output terminal, and an integrator coupled between said second output terminal and said first output terminal, said method comprising:

coupling a first resistor in series between said input terminal and said first output terminal;

coupling a second resistor in series between said input terminal and said second output terminal; and coupling one of a third resistor and a capacitor in series between an input signal source and said input terminal, wherein coupling said third resistor provides said first set of filter responses and coupling said capacitor provides said second set of filter responses.

24. A method of electrically filtering an input signal from an input signal source with a filter having an input terminal first output terminal and a second output terminal, said method comprising:

filtering said input signal to provide a low pass frequency response at the first output terminal and a band-pass frequency response at the second output terminal in response to a resistor coupled in series between said input terminal and said input signal source; and filtering said input signal to provide said band-pass frequency response at said first output terminal and a high pass frequency response at said second output terminal in response to a capacitor coupled in series between said input terminal and said input signal source.

* * * * *

UNITED STATES PATENT AND TRADEMARK OFFICE
CERTIFICATE OF CORRECTION

PATENT NO. : 6,271,719 B1
DATED : August 7, 2001
INVENTOR(S) : Sevastopoulos, Nello George It is certified that error appears in the above-identified patent and that said Letters Patent is hereby corrected as shown below:

<u>Column 10,</u>
Line 2, change "1001Cx10k" to -- 1001C=10k --.

Signed and Sealed this

Fifth Day of March, 2002

Attest:

Attesting Officer

JAMES E. ROGAN
Director of the United States Patent and Trademark Office